United States Patent [19]

Lawman

[11] Patent Number: 5,949,690
[45] Date of Patent: Sep. 7, 1999

[54] SCHEMATIC DESIGN ENTRY WITH ANNOTATED TIMING

[75] Inventor: Gary R. Lawman, San Jose, Calif.

[73] Assignee: Xilinx, Inc., San Jose, Calif.

[21] Appl. No.: 08/938,208

[22] Filed: Sep. 26, 1997

[51] Int. Cl.[6] .................................................. G06F 17/50
[52] U.S. Cl. ........................................ 364/488; 364/489
[58] Field of Search .................................. 364/488, 489, 364/490, 491, 468.28, 578

[56] References Cited

U.S. PATENT DOCUMENTS

| | | | |
|---|---|---|---|
| 4,855,726 | 8/1989 | Nishio | 340/747 |
| 4,970,664 | 11/1990 | Kaiser et al. | 364/521 |
| 5,095,454 | 3/1992 | Huang | 364/578 |
| 5,150,308 | 9/1992 | Hooper et al. | 364/489 |
| 5,155,836 | 10/1992 | Jordan et al. | 395/500 |
| 5,197,016 | 3/1993 | Sugimoto et al. | 364/490 |
| 5,220,512 | 6/1993 | Watkins et al. | 364/489 |
| 5,446,675 | 8/1995 | Yoshimura | 364/489 |
| 5,461,576 | 10/1995 | Tsay et al. | 364/490 |
| 5,544,067 | 8/1996 | Rostoker et al. | 364/489 |
| 5,555,201 | 9/1996 | Dangelo et al. | 364/489 |
| 5,576,979 | 11/1996 | Lewis et al. | 364/578 |
| 5,594,657 | 1/1997 | Cantone et al. | 364/490 |
| 5,610,828 | 3/1997 | Kodosky et al. | 364/489 |
| 5,623,418 | 4/1997 | Rostoker et al. | 364/489 |
| 5,673,198 | 9/1997 | Lawman | 364/489 |
| 5,721,959 | 2/1998 | Nakamura et al. | 395/919 |
| 5,754,442 | 5/1998 | Minagawa et al. | 364/489 |

OTHER PUBLICATIONS

"The Programmable Logic Data Book", published in Sep., 1996 by Xilinx, Inc. and available from Xilinx, Inc., 2100 Logic Drive, San Jose, California 95124.

*The Programmable Logic Data Book*, "XC4000E Switching Characteristics Guidelines", pp. 4–85, published in Sep., 1996, by Xilinx, Inc., 2100 Logic Drive, San Jose, California 95124.

Xilinx Application Note XAPP018 entitled, "Estimating the Performance of XC4000E Adders and Counters", (Version 2.0), published Jul. 4, 1996, pp. 1–4, available from Xilinx, Inc., 2100 Logic Drive, San Jose, California 95124.

"XACT Viewlogic Interface User Guide", published Apr., 1994, pp. 15–39 to 15–43, available from Xilinx, Inc., 2100 Logic Drive, San Jose, California 95124.

*Primary Examiner*—Kevin J. Teska
*Assistant Examiner*—Leigh Marie Garbowski
*Attorney, Agent, or Firm*—Lois D. Cartier

[57] ABSTRACT

The invention provides to the user a way of ascertaining the estimated delay through a circuit, by placing a timing attribute on the schematic symbol for the circuit that automatically displays the estimated delay. Reported delays may include maximum delay, typical delay, and/or minimum delay on the critical path. In a first embodiment, the schematic entry software consults a macro speeds file to obtain delay information for the macro. In a second embodiment, the macro delay information is added to the standard device speeds file. In a third embodiment, the symbol file (or other file) for the macro includes a formula for the critical path delay through the macro, based on the delays in the standard device speeds file. The schematic entry software therefore uses the standard device speeds file to calculate the macro delay. According to a second aspect of the invention, schematic-entry software accepts pointer-driven (e.g., mouse-driven) input designating starting and ending points on a path, and reports the path delay between these points. According to a third aspect of the invention, schematic-entry software accepts pointer-driven input designating a group of schematic symbols and reports the path delay on the critical paths through the circuit comprising the designated symbols.

9 Claims, 7 Drawing Sheets

XC4000E CLB Switching Characteristic Guidelines

| Speed Grade | | -2 | |
|---|---|---|---|
| Description | Symbol | Min | Max |
| Combinatorial Delays<br>F/G inputs to X/Y outputs<br>F/G inputs via H' to X/Y outputs<br>C inputs via SR through H' to X/Y outputs<br>C inputs via H' to X/Y outputs<br>C inputs via DIN through H' to X/Y outputs | TILO<br>TIHO<br>THH0O<br>THH1O<br>THH2O | | 1.6<br>2.7<br>2.4<br>2.2<br>2.6 |
| CLB Fast Carry Logic<br>Operand inputs (F1,F2,G1,G4) to COUT<br>Add/Subtract input (F3) to COUT<br>Initialization inputs (F1,F3) to COUT<br>CIN through function generators to X/Y outputs<br>CIN to COUT, bypass function generators | TOPCY<br>TASCY<br>TINCY<br>TSUM<br>TBYP | | 2.1<br>3.7<br>1.4<br>2.6<br>0.6 |
| Sequential Delays<br>Clock K to outputs Q | TCKO | | 2.8 |
| Setup Time before Clock K<br>F/G inputs<br>F/G inputs via H'<br>C inputs via H0 through H'<br>C inputs via H1 through H'<br>C inputs via H2 through H'<br>C inputs via DIN<br>C inputs via EC<br>C inputs via S/R, going Low (inactive)<br>CIN input via F'/G'<br>CIN input via F'/G' and H' | TICK<br>TIHCK<br>THH0CK<br>THH1CK<br>THH2CK<br>TDICK<br>TECCK<br>TRCK<br>TCCK<br>TCHCK | 2.4<br>3.9<br>3.5<br>3.3<br>3.7<br>2.0<br>2.6<br>4.0<br><br> | |

FIG. 1
(Prior Art)

@I0DLY0=0
@I0DLY1=0
@I1DLY0=0
@I1DLY1=0
@ODLY0=1
@ODLY1=1

V 4.1
|
| Wirelist created using VIEWSIM WIRELISTER 4.11
| Using initialization file '/tools/viewlogic/vl4_1/wv4_1/standard/vsm.ini'
|      Using 24 attribute filter(s)
| Long format VIEWSIM file for project XOR2
|
DW XOR2 3 22968322990
M $1113 BUF ( TPHL=0 TPLH=0 ) $1N15 I1
M $1114 BUF ( TPHL=0 TPLH=0 ) $1N17 I0
M $1118 XOR2 ( TPHL=1 TPLH=1 ) O $1N15 $1N17
WD

LCANET, 6
PROG, WIR2XNF, 5.2.0, "created from xor2"
PART, 4003epc84-2
SYM, $1113, BUF, SCHNM=BUF, =TPLH=0, =TPHL=0
PIN, Q, O, $1N15
PIN, A, I, I1
END
SYM, $1114, BUF, SCHNM=BUF, =TPLH=0, =TPHL=0
PIN, Q, O, $1N17
PIN, A, I, I0
END
SYM, $1118, XOR2, SCHNM=XOR2, =TPLH=1, =TPHL=1
PIN, Q, O, O
PIN, A, I, $1N15
PIN, B, I, $1N17
END
EOF

SCHEMATIC DESIGN ENTRY WITH ANNOTATED TIMING

CROSS-REFERENCE TO RELATED APPLICATION

This application relates to the following commonly assigned co-pending U.S. patent application Ser. No. 08/625,480 invented by Gary R. Lawman and Robert W. Wells entitled "Concurrent Electronic Circuit Design and Implementation", which is incorporated herein by reference.

BACKGROUND OF THE INVENTION

1. Field of the Invention

The invention relates to design entry of electronic circuits. More particularly, the invention relates to a method for annotating timing onto a schematic for a circuit.

2. Description of the Background Art

As the electronics industry evolves, the typical operating speed of integrated circuits (ICs) changes frequently. Therefore, it is important for an IC designer to be able to rapidly determine the speed at which a signal will traverse a path through a proposed circuit in the IC. If the signal cannot traverse the path within the desired time period, the circuit may have to be modified or replaced. If the signal will predictably traverse the path in less than the available amount of time, some of the extra time may be used to perform other logical functions. Therefore, it is important to IC designers to be able to predict, with at least some degree of accuracy, the speed at which various portions of their circuits will operate. One field in which this requirement is particularly important is that of Field Programmable Gate Arrays (FPGAs), where a circuit may have different delays when implemented in different speed grades or in different FPGAs, and an FPGA may be selected for use in a system based primarily on the speed of the circuit as implemented in that particular FPGA.

One method for estimating circuit operating speed in an FPGA is a manual estimation technique that involves tracing each delay in the circuit manually and looking up delay values in tables provided by the FPGA manufacturer. One source for such information is "The Programmable Logic Data Book" (hereinafter referred to as "The Xilinx 1996 Data Book"), published in September, 1996 by Xilinx, Inc., and available from Xilinx, Inc., 2100 Logic Drive, San Jose, Calif. 95124. Suppose, for example, that an FPGA user wishes to predict the delay through a simple circuit such as a 2-input exclusive-OR (XOR2) gate, in an XC4003E FPGA device in the −2 speed grade. (Each Xilinx FPGA is assigned, after testing, a number preceded by a dash to indicate to which of several "speed grades" a particular packaged device is assigned. Each speed grade is guaranteed to meet a specific set of corresponding timing requirements.) The FPGA user must first be familiar enough with the architecture of the XC4003E device to realize that the XOR2 circuit can be implemented in a single function generator. The FPGA user can then predict the corresponding delay by consulting page 4-85 of the Xilinx 1996 Data Book, which is incorporated herein by reference, and a portion of which is reproduced in FIG. 1. Consulting this page, which is devoted to "XC4000E CLB Switching Characteristic Guidelines", the FPGA user looks under the heading "Combinatorial Delays" and identifies the symbol "TILO" as representing the delay through a single function generator. "TILO" for the −2 speed grade is 1.6 ns, therefore the delay for an XOR2-gate in an XC4003E-2 device is 1.6 ns. However, this estimated delay does not take into account such factors as net delay in reaching the inputs of the gate, nor a net delay on the gate output. In this case, the FPGA user might estimate a net delay of 0.5 ns, for a total delay through the XOR2-gate of 2.1 ns (1.6 ns block delay+0.5 ns net delay). For some circuits, these net delays can be larger than the delay through the function generator.

As a second example, consider a binary 8-bit counter such as the one shown in FIG. 2. This 8-bit counter comprises eight flip-flops (200–207). Each flip-flop corresponds to one bit of the counter, with flip-flop 200 generating bit Q0 (the least significant bit), flip-flop 201 generating bit Q1, and so forth up to flip-flop 207 generating bit Q7 (the most significant bit). Each flip-flop is reset by signal CLR. The data input D of flip-flop 200 is driven by bit Q0, inverted by inverter 210. Therefore, bit 0 toggles with every active edge on clock CK. The data inputs D of flip-flops 201–207 are driven by XOR2-gates 211–217, respectively. XOR2-gate 211 has as inputs Q1 (the related counter bit) and carry-in signal CIN1 (which could equally correctly have been labeled Q0 or as carryout signal COUT0). Carry-in signal CIN1 and bit Q1 are also ANDed together in AND2-gate 221 to generate carry-out signal COUT1 (which is labeled CIN2, since it also forms the carry-in signal for the next bit). The other XOR2-gates 212–217 and AND2-gates 222–226 are similarly connected to the outputs Q2–Q7 of their corresponding flip-flops 202–207.

To manually estimate the delay through the counter the FPGA user must understand how the logic will be mapped into FPGA configurable logic blocks (CLBs) and function generators in the target FPGA device. When the counter shown in FIG. 2 is mapped into an XC4003E device, two bits of the counter will be placed in each CLB, as shown in FIG. 3. FIG. 3 indicates (by way of boxes 330, 332, 334, 336) the mapping of the logic in the counter into four CLBs. The maximum operating speed of this counter is determined by the settling time of the carry chain from least significant to most significant bit. The critical path (the path determining the maximum operating speed of the circuit) therefore comprises the path from clock CK, through flip-flop 200 to output Q0, then along the carry chain through AND2-gates 221, 222, 223, 224, 225, and 226, through XOR2-gate 217, and a setup time at flip-flop 207. Net delays from flip-flop output Q0 to the input of AND2-gate 221, and from each AND2-gate to the succeeding AND2-gate, must be added as well. The FPGA user can therefore calculate the estimated speed of the counter by summing: 1) clock-to-out for flip-flop 200; 2) six times the estimated average net delay from a flip-flop or AND2-gate output to an AND2-gate input; 3) five times the delay through an AND2-gate (one function generator delay each); 4) the delay through AND2-gate 226 and XOR2-gate 217 (one function generator delay for both); and 5) the setup time on input D of flip-flop 207. Consulting the data book information in FIG. 1, and estimating the average net delay based on previous experience with FPGAs, the estimated delay through the critical path for the counter of FIGS. 2 and 3 can be calculated:

Delay = TCKO + (6 * estimated net delay) + (5 * TILO)
    + TILO + TICK
  = 2.8 ns + (6 * 0.4 ns) + (5 * 1.6 ns) + 1.6 ns + 2.4 ns
  = 17. 2 ns However, to provide a third example of manual delay estimation, XC4000E CLBs also offer special fast carry logic, and library macros (schematics and symbols representing commonly used circuits, such as counters) that use this special logic are provided to XC4000E users. Speed estimation methods for counters and adders that use the fast carry logic are explained in Xilinx Application Note XAPP018 (Version 2.0), entitled "Estimating the Performance of XC4000E Adders and Counters", published Jul. 4, 1996 and available from Xilinx, Inc., 2100 Logic Drive, San Jose, Calif. 95124, which is incorporated herein by reference. Briefly, the propagation delay of an 8-bit counter using fast carry logic comprises the following delays: 1) the delay in getting onto the carry chain in the first CLB, corresponding to CLB 330; 2) two times the delay on the carry chain through a single CLB (two CLBs of two bits each, corresponding to CLBs 332 and 334); and 3) the delay in getting off the carry chain in the fourth CLB, corresponding to CLB 336. The delay can therefore be calculated using the formula:

Delay=TOPCY+(2*TBYP)+TSUM

Consulting the data book information in FIG. 1, the estimated delay of this counter in an XC4003E device with a −2 speed grade is found to be:

Delay=2.1 ns+(2*0.6 ns)+2.6 ns=5.9 ns.

Therefore, it is seen that the delay of even a simple circuit such as a counter may be heavily dependent on the particular implementation used in the macro, and the manual estimation method may be relatively involved.

A more automated method currently used for estimating the speed of an FPGA circuit involves mapping, placing, and routing the design, and writing out a netlist description of the completed design. (A "netlist" is a description of a circuit comprising a list of low-level circuit elements or gates and the connections (nets) between the outputs and inputs thereof. A netlist is typically stored as one or more computer files.) The next step is to run a software tool that inserts delays into the netlist corresponding to the delays that will be incurred by a signal traversing each element in the netlist. These delays are typically read from a file called a device speeds file. (A device speeds file may include delays for one or more different FPGAs or other programmable ICs, or may include delays for one or more elements in a standard cell library that may be used for designing custom ICs.) The device speeds file may be encrypted. A given FPGA device speeds file is typically specific to a particular FPGA device, and may include information for several different speed grades of the device. After inserting timing delays into the netlist, the software tool produces a report on the overall speed of the resulting design, or it can be directed to report the delay associated with a particular path through the design. One such software tool is the XDelay software from Xilinx, Inc. A step-by-step description of how to use the XDelay software to report path delays in a mapped, placed, and routed FPGA design is included in pages 15-39 through 15-43 of the "XACT Viewlogic Interface User Guide", published April, 1994, available from Xilinx, Inc., 2100 Logic Drive, San Jose, Calif. 95124, which are incorporated herein by reference. These methods typically produce relatively accurate reports of timing delays to be expected from the circuit when programmed into an FPGA.

One automated method for displaying timing for an FPGA circuit is described by Lawman and Wells in commonly assigned, co-pending U.S. patent application Ser. No. 08/625,480 [docket X-226 US] entitled "Concurrent Electronic Circuit Design and Implementation", filed Mar. 29, 1996, which is referenced above and incorporated herein by reference. However, this method requires software post-processing to map, place, and route the circuit before a timing estimate can be provided. This post-processing is often time-consuming.

FIG. 4 shows a schematic for an XOR2-gate that is used when designing circuits for Xilinx FPGAs using the Workview schematic entry environment from Viewlogic Systems, Inc. The XOR2-gate is an element in a library of macros provided by Xilinx or by Viewlogic Systems, Inc. to their customers. This XOR2-gate schematic is also a simulation model used to perform logic and timing simulations of the XOR2-gate and of higher-level schematics incorporating this gate. The schematic includes timing information for the gate. As shown in FIG. 4, the schematic comprises two buffer symbols 401, 402 and one symbol 403 representing the exclusive-OR function. Each of symbols 401, 402, 403 has two associated timing variables. For example, symbol 403 has the notation "TPLH=@ODLY1", which means that the Timing Period on the Low to High transition when passing through this logic is represented by a variable "ODLY1". Similarly, the notation "TPHL=@ODLY0" on symbol 403 means that the Timing Period on the High to Low transition is represented by a variable "ODLY0".

FIG. 5 shows the Workview XOR2 schematic symbol that corresponds to the XOR2 schematic of FIG. 4. (Timing attributes have been made visible using the Workview "Change Attributes Visible" command. Attributes other than timing variables are not shown in FIG. 5.) The timing variables from the schematic of FIG. 4 are also present in the schematic symbol of FIG. 5, and in FIG. 5 they are assigned default values. For example, the notation "@ODLY1=1" means that the default delay for the low to high transition on symbol 403 is 1 timing unit, or 0.1 ns. (The basic time unit for Workview is 0.1 nanoseconds, or 100 picoseconds.) The notation "@IODLY0=0" in FIG. 5 means that the default delay for the high to low transition of symbol 402 is 0 ns. These attributes on the symbol are the Workview software's method of passing the timing information from the simulation model (shown in FIG. 4) to the Workview simulator. This timing information is nominal and does not reflect the performance of the circuit in a mapped, placed, and routed design. Therefore, it has no value for delay estimation purposes.

When the XOR2-gate of FIGS. 4 and 5 is converted to a viewsim™ simulation netlist, the simulation netlist is written as appears in FIG. 6. (Viewsim is the Workview simulation software tool. Viewsim is a trademark of Viewlogic Systems, Inc.) The netlist description of FIG. 6 provides an example of how timing delays can be incorporated into a netlist. In this example, each symbol is represented by a single line of text. For example, symbol 403 is represented by line 600. FIG. 7 shows another type of netlist showing incorporation of the default delays. The netlist of FIG. 7 is in Xilinx Netlist Format (XNF). In this netlist, symbol 403 is represented by lines 12 through 16 (labeled 700). To obtain a netlist having actual delays rather than the default values for TPHL and TPLH, the circuit must be mapped, placed, and routed, and the resulting netlist must be back-annotated with delays using the XDelay program.

An advantage to this automated method is that it is no more difficult for a user to obtain the delay through a large, complicated circuit than it is through a simple circuit such as an XOR2-gate, although it may take longer because of increased software execution time. A disadvantage of this method for estimating FPGA circuit delays is that the circuit must be implemented (mapped, placed, and routed) before the user can receive any information about the speed of the circuit. If design changes are made as a result of the timing information, the circuit must be reimplemented to assess the results of the changes. Further, in order to implement the circuit, the circuit must be transformed into a complete FPGA design, i.e., input/output pads must be added, and each circuit output must either drive some destination circuitry or be marked so the software will retain what appears to be unused logic. This process can therefore be time-consuming. Some FPGA users prefer to make one or more iterations of the design process based on a manual estimation of the delay through the circuit, before proceeding to the accurate estimations produced by the above method.

It is desirable to have a way of estimating the delay through an FPGA circuit without consulting a data book, without manually adding together many small delays, and without mapping, placing and routing the circuit.

SUMMARY OF THE INVENTION

The invention provides a way of providing the estimated delay through a circuit to the user, by placing a timing attribute on the schematic symbol for the circuit that automatically displays the delay. Reported delays may include maximum delay, typical delay, and/or minimum delay on the most critical paths. In a first embodiment, the schematic entry software consults a macro speeds file to obtain delay information for the macro. A macro speeds file is a file including delay information for one or more macros. The macro speeds file may be in encrypted form. In a second embodiment, the macro delay information is added to a standard device speeds file. In a third embodiment, the symbol file (or other file) for the macro includes a formula for the critical path delay through the macro, based on the delays in the standard device speeds file. In this third embodiment, the schematic entry software uses the standard device speeds file to calculate the macro delay.

According to a second aspect of the invention, schematic-entry software accepts mouse-driven input designating starting and ending points on a path, and reports the path delay between these points. According to a third aspect of the invention, schematic-entry software accepts mouse-driven input designating a group of schematic symbols and reports the path delay on the critical paths through the circuit comprising the designated symbols.

BRIEF DESCRIPTION OF THE DRAWINGS

The present invention is illustrated by way of example, and not by way of limitation, in the following figures, in which like reference numerals refer to similar elements.

FIG. 1 shows a portion of a Xilinx data book page used to make manual estimations of delays through a macro.

FIG. 6 shows the simulation netlist for an XOR2-gate, for Viewsim, the Workview simulator.

FIG. 7 shows the XNF netlist for an XOR2-gate.

DETAILED DESCRIPTION OF THE DRAWINGS

A method for annotating estimated timing delays onto a schematic according to the invention is described. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 2:
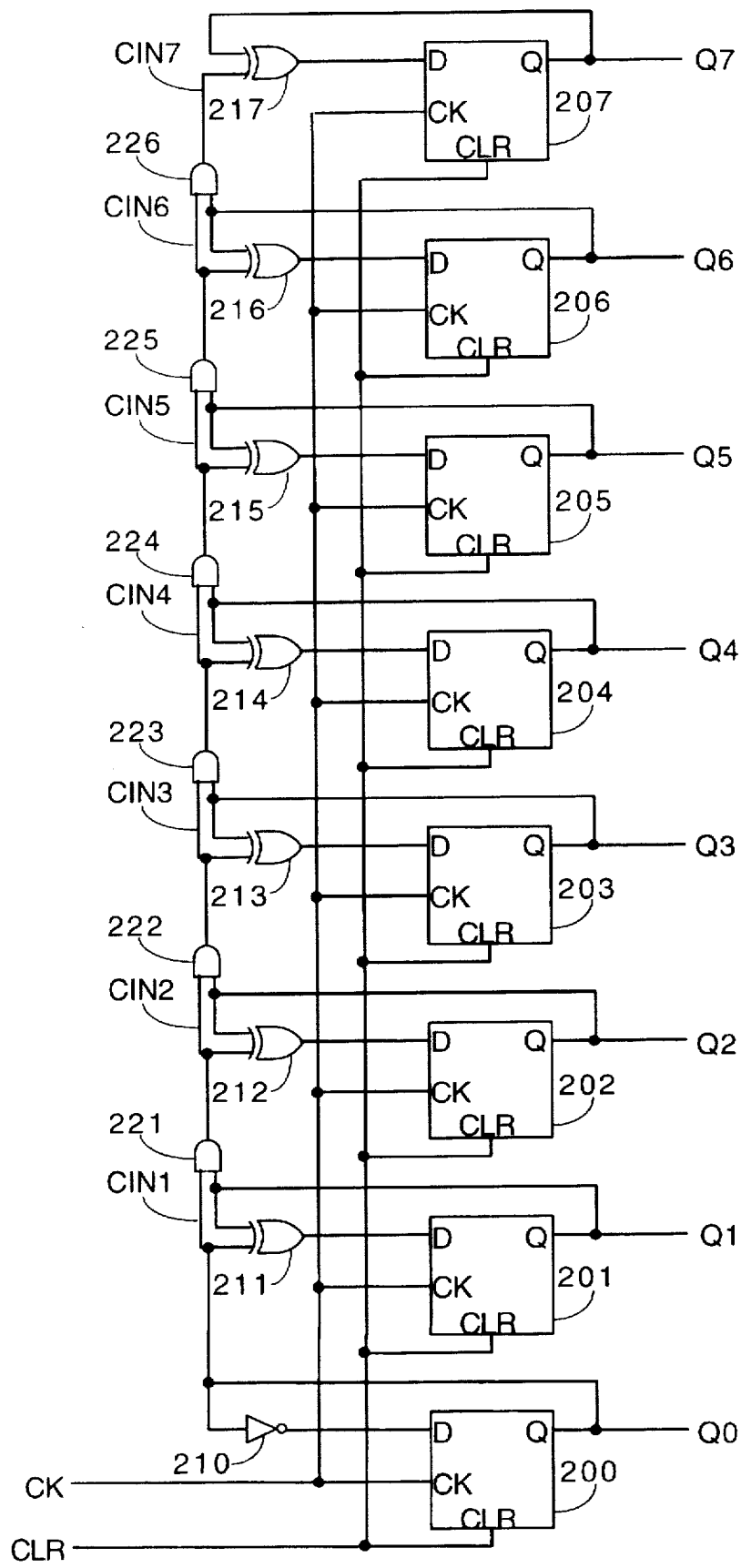
FIG. 2 shows an 8-bit counter.
Figure 3:
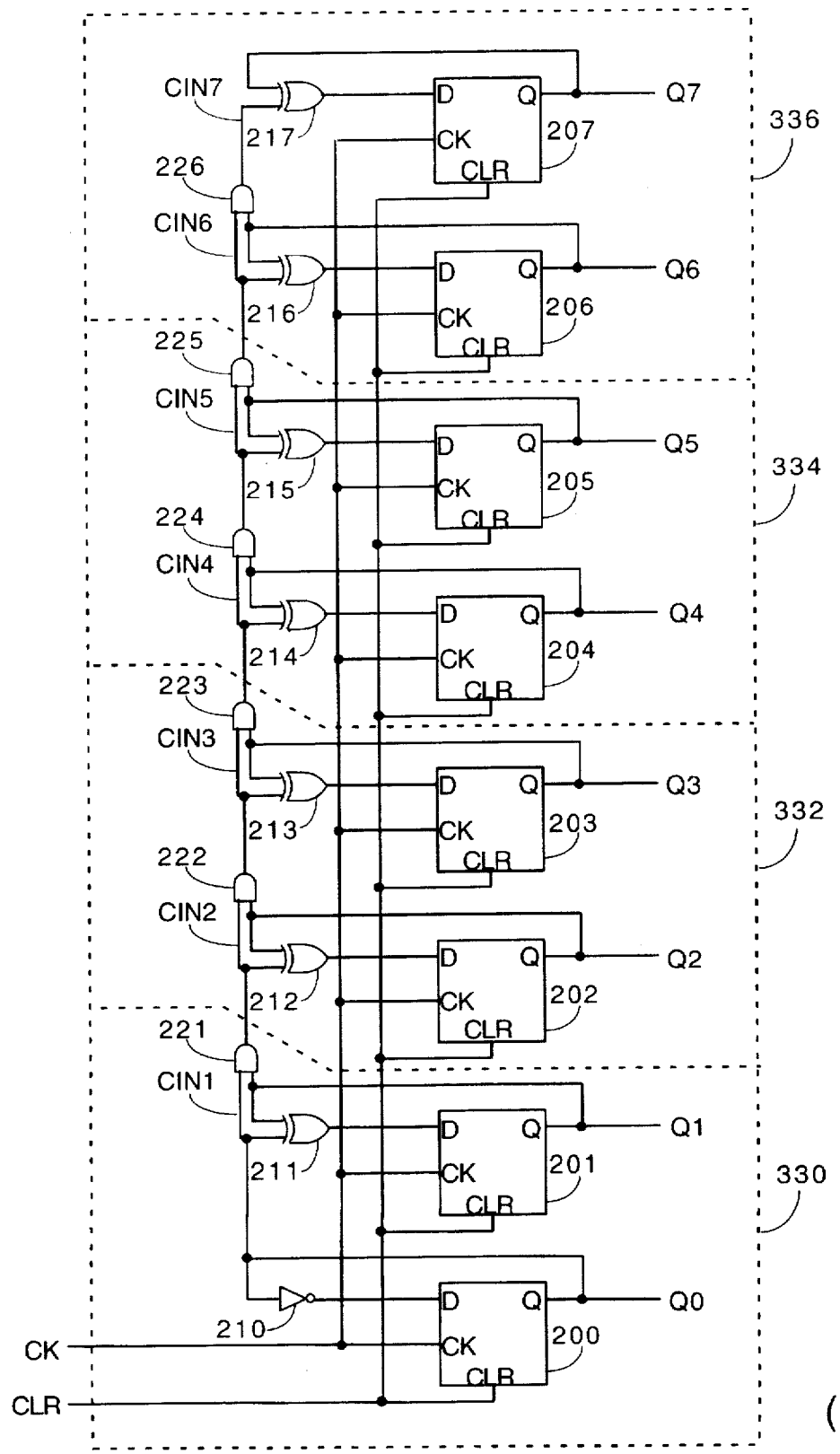
FIG. 3 shows how the 8-bit counter of FIG. 2 is mapped into a Xilinx XC4003E device.
Figure 4:
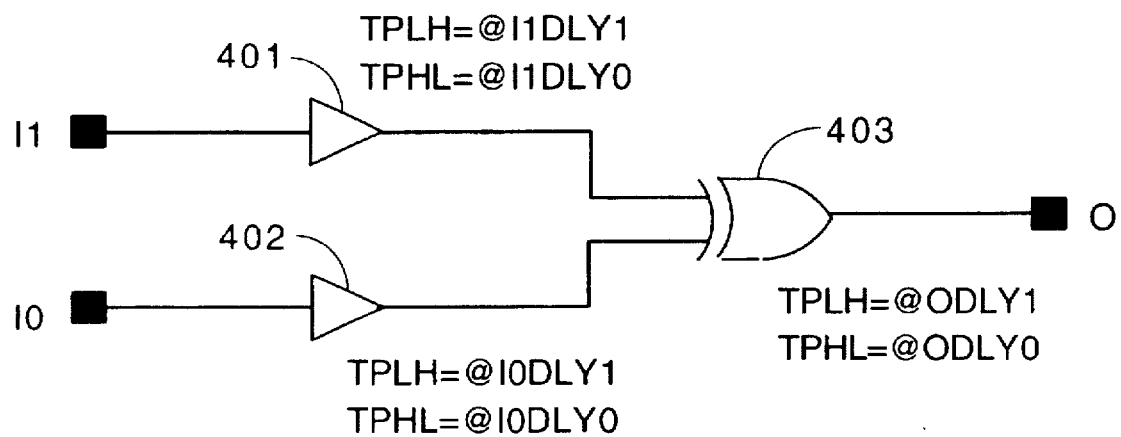
FIG. 4 shows the Workview schematic simulation model for an XOR2-gate.
Figure 5:
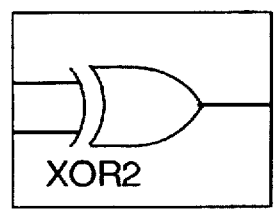
FIG. 5 shows the Workview symbol for an XOR2-gate, with timing attributes.
Figure 8A:
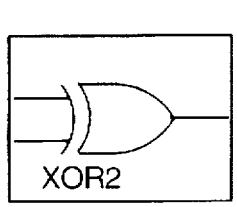
FIG. 8A shows a symbol according to the invention as it would appear in a symbol editor, with the timing attribute displayed.
Figure 8B:
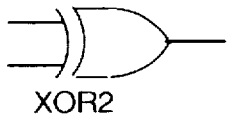
FIG. 8B shows a symbol according to the invention placed in a higher-level schematic, the symbol representing an XOR2-gate and displaying the delay through the XOR2 circuit.

FIG. 8A shows a macro symbol for an XOR2-gate as it would appear in a symbol editor, with the associated timing attribute @DLYXOR2 displayed. Timing attribute @DLYXOR2 is somewhat similar to the attributes @ODLY0 and @ODLY1 of FIGS. 4 and 5. However, timing attribute @DLYXOR2 provides additional functionality compared to prior art attributes @ODLY0 and @ODLY1. In accordance with the invention, when the macro symbol is placed in a higher-level schematic as in FIG. 8B, the symbol is displayed with a numerical value given for the estimated delay. In FIG. 8B, the displayed delay for the XOR2-gate is 2.1 ns, the block delay (delay through the CLB) of 1.6 ns plus the estimated net delay of 0.5 ns, in accordance with the first example of manually estimating circuit operating speeds.

Figure 8C:
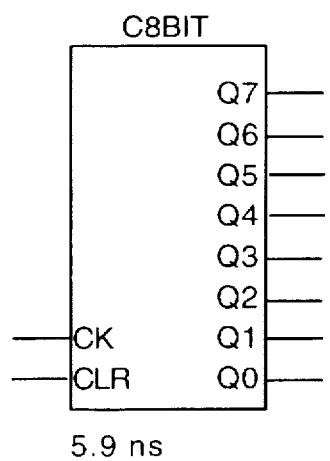
FIG. 8C shows a symbol according to the invention placed in a higher-level schematic, the symbol representing an 8-bit counter and displaying the delay for the critical path through the counter.

FIG. 8C shows a macro symbol for an 8-bit counter annotated with estimated timing according to the invention. In FIG. 8C, the displayed delay for the 8-bit counter using fast carry logic is 5.9 ns. (This is the same counter used in the third example of manually estimating circuit operating speeds, above.) Note that for an FPGA user, estimating the delay through the counter is now a simple matter of placing the schematic symbol for the counter macro into a higher-level schematic, rather than the steps of investigating the counter schematic, figuring out how the logic will be apportioned into CLBs, determining the critical path, looking up block delays in a data book, estimating net delays, and adding the incremental delays to produce a total estimated delay for the counter. In one embodiment, the critical path for which the delay is reported is shown on or near the displayed symbol, either in text form, by highlighting the terminals of the critical path, by drawing a line between the terminals, or by other means. In another embodiment, multiple delays are reported where several critical paths having similar delays are present. In this embodiment, the terminals of the critical paths may be visually identified with the delays to which they correspond, for example by highlighting the terminals of each path and the associated delay in the same color. In one embodiment, a color code based on the well-known resistor color code is used. The most critical path is shown in black, the next most critical is shown in brown, followed by red, orange and so forth. In another embodiment, the criticality is indicated by a color range from black through blue, red, and orange and on to white. This display method draws an analogy between delay and temperature. The more a delay differs from the critical path delay, the greater the difference in color.

Figure 9A:
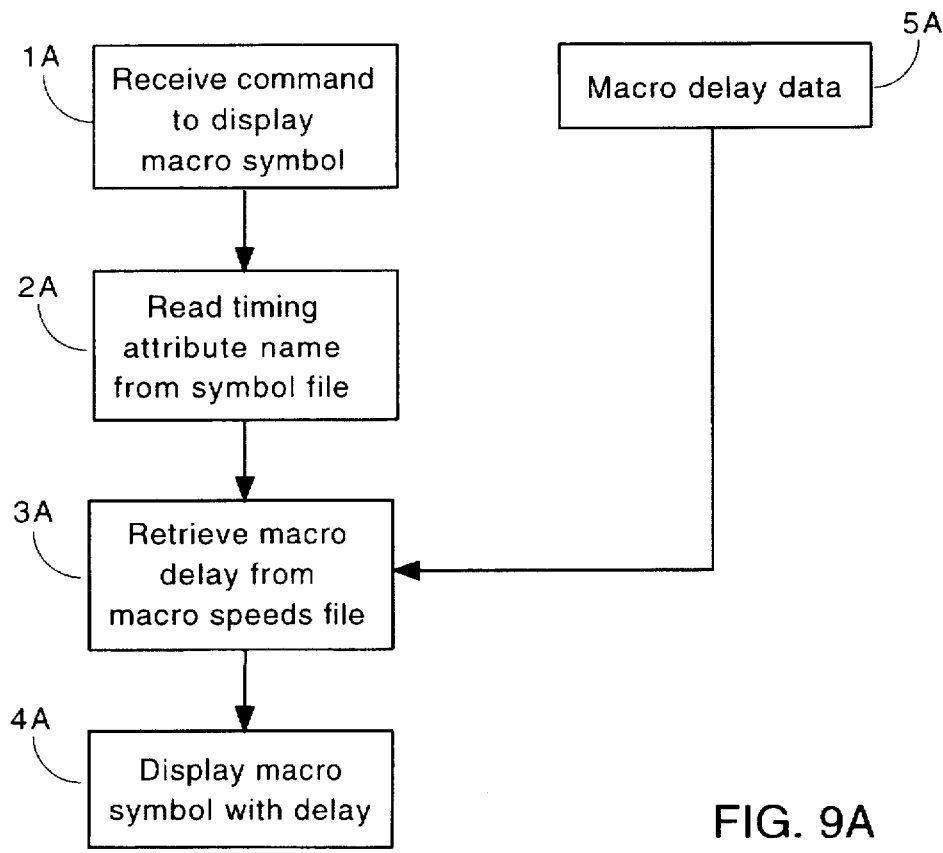
FIG. 9A shows a flow chart for annotating macro delays onto a schematic according to a first embodiment of the invention.

According to a first embodiment of the invention, the schematic entry software displays the macro delay by following the series of steps shown in FIG. 9A. In step 1A, a command is received to display the schematic symbol representing the macro. The command may be received as a distinct command from a user (such as an Add Component command in Workview), or as a result of an automatic display function (such as when viewing an existing schematic already containing the macro symbol), or in some other fashion. In step 2A, in response to the received command, the schematic entry software reads the timing attribute from the symbol file (the file storing the display information for the symbol). (In one embodiment, the timing attribute is stored in a different file. In another embodiment, the schematic entry software uses the name of the macro, or a variation thereof, as the timing attribute, and no other timing attribute is stored.) In step 3A, the schematic entry software retrieves the macro delay from a macro speeds file 5A that contains delay information for the timing attribute. In step 4A, the macro delay is displayed with the macro symbol, as shown in FIGS. 8A and 8B. In one embodiment, the speed grade is specified by a separate attribute, and a default speed grade is used if none is so provided. The macro speeds file includes separate timing information for each available speed grade.

Figure 9B:
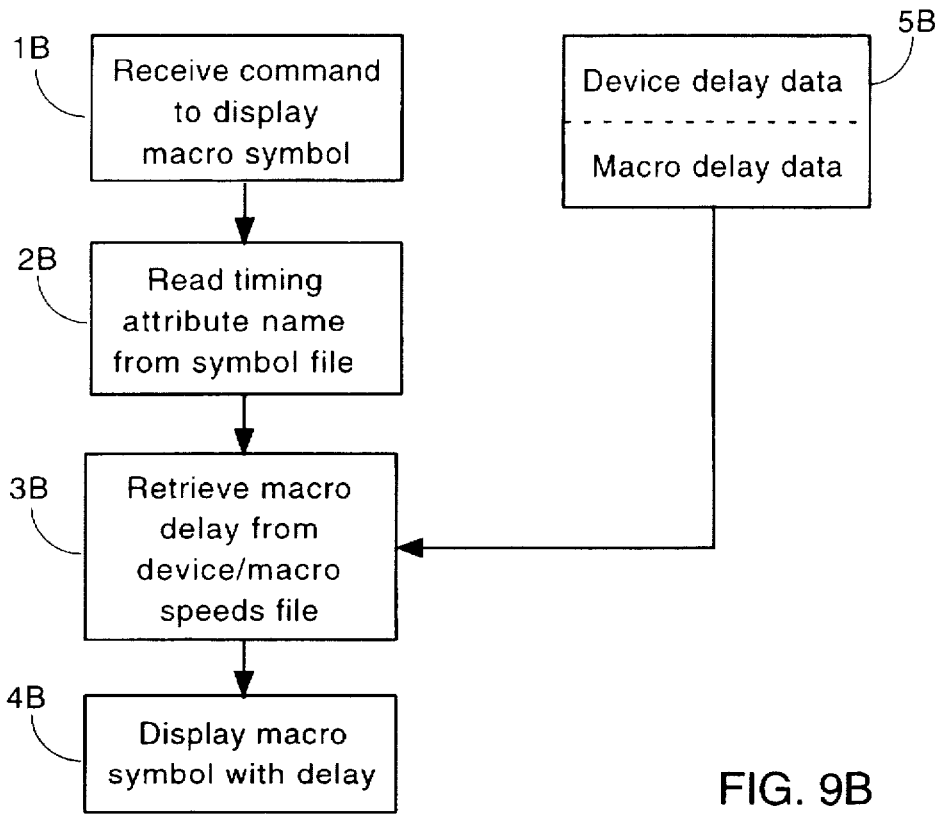
FIG. 9B shows a flow chart for annotating macro delays onto a schematic according to a second embodiment of the invention.

According to a second embodiment of the invention, the schematic entry software displays the macro delay by following the series of steps shown in FIG. 9B. The second embodiment is similar to the first embodiment, except that in step 3B the schematic entry software retrieves the macro delay from a device/macro speeds file 5B that contains delay information for the timing attribute as well as device delay data commonly stored in a device speeds file. (Device delay data includes delay information for possible paths through a CLB (such as that shown in FIG. 1) or an input/output block (IOB), as well as net delay information. Separate delay data is provided for each available speed grade.)

Figure 9C:
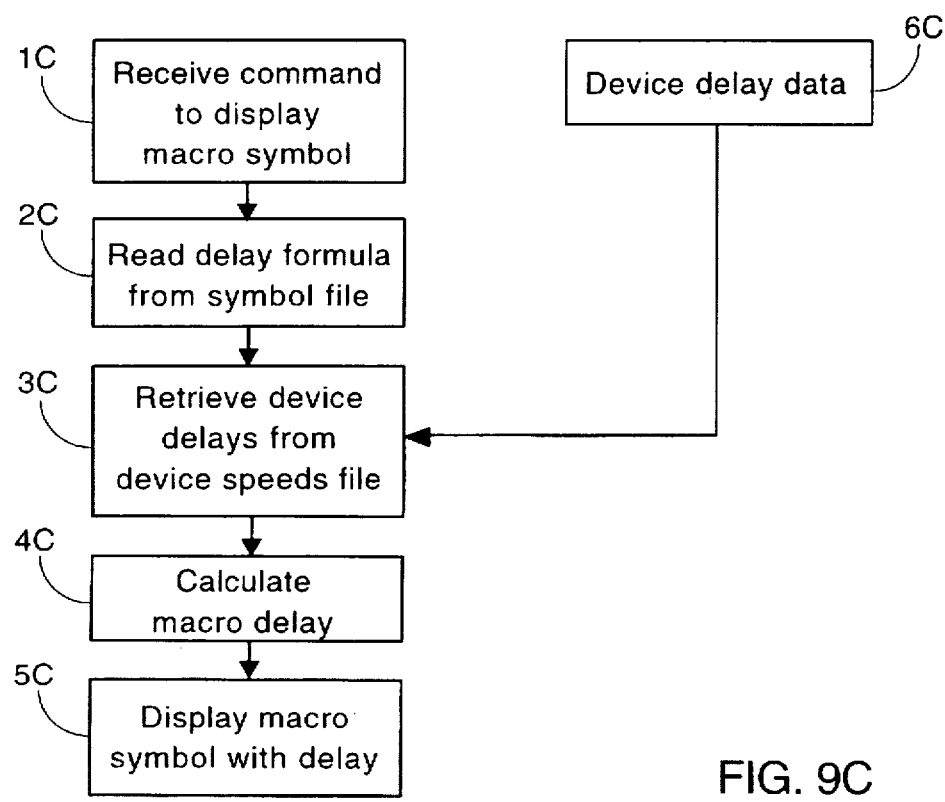
FIG. 9C shows a flow chart for annotating macro delays onto a schematic according to a third embodiment of the invention.

According to a third embodiment of the invention, the schematic entry software displays the macro delay by following the series of steps shown in FIG. 9C. In step 1C, a command is received to display the symbol representing the macro. In step 2C, in response to the received command, the schematic entry software reads from the symbol file the delay formula representing the macro delay in terms of delays included in the device speeds file. (In another embodiment, the delay formula is stored in a different file.) In step 3C, after reading the delay formula, the schematic entry software retrieves the device delays from the device speeds file 6C. The next step (step 4C) is to calculate the macro delay based on the timing formula and the delays retrieved from the device speeds file. This step may involve adding together the delays from the device speeds file as dictated by the formula, including whatever net delays the formula may specify. In step 5C, the macro delay is displayed with the macro symbol, as shown in FIGS. 8A and 8B. An advantage of this embodiment is that a device speeds file already in use need not be altered to add the delay annotation functionality.

In some embodiments, more than one macro delay is displayed for a single macro symbol. These macro delays can designate different paths through the macro, different conditions (such as maximum and minimum speeds), different FPGA devices, or different FPGA device speed grades. Such options would assist an FPGA designer in making choices such as which FPGA device to use. In some embodiments, the schematic entry software provides options to select one or more of multiple available macro delays for display. In one embodiment, block delays and net delays are separately displayed.

According to a second aspect of the invention, a path is designated by pointing to and designating the terminal points (endpoints) of the path with a mouse or other pointing device. Any of the delay calculation techniques described above is then applied to the designated path and graphically displayed or written to a log file, preferably along with the names of the terminal signals.

According to a third aspect of the invention, an area of the graphically displayed circuit schematic is designated with a mouse or other pointing device. The area designation can be accomplished by designating two corners of a rectangular area, by "drawing" a line around the area, or by other well-known techniques. Schematic symbols within the designated area are then analyzed using any of the delay calculation techniques described above to determine the most critical paths. The delays through the most critical paths are reported, in one embodiment along with the names of the terminal signals of those paths. In one embodiment, the terminals of the most critical path are highlighted. In another embodiment, the number of critical paths to be displayed is a user-specified option. In yet another embodiment, the user can specify a delay period (e.g., 1 nanosecond) such that any paths having a delay within the delay period of the most critical path are to be displayed.

The above text describes the timing annotation method of the invention in the context of FPGAs. However, the invention can also be applied to other fields of the electronic design art, such as the design of custom ICs, PLDs, or ASICs using standard cell libraries.

Those having skill in the relevant arts of the invention will now perceive various modifications and additions which may be made as a result of the disclosure herein of preferred embodiments. Accordingly, all such modifications and additions are deemed to be within the scope of the invention, which is to be limited only by the appended claims and their equivalents.

What is claimed is:

1. A method for displaying a macro symbol, the method comprising the steps of:

a) receiving a command to display the macro symbol; and
 b) displaying the macro symbol along with a multiplicity of associated delays,
     wherein the displayed delays comprise delays for the same path through the macro under different operating conditions.

2. The method of claim 1 wherein the displayed delays comprise minimum and typical delays.

3. A method for displaying a macro symbol, the method comprising the steps of:

a) receiving a command to display the macro symbol; and
 b) displaying the macro symbol along with a multiplicity of delays,
     wherein the displayed delays comprise delays for the same circuit implemented in different FPGAs.

4. The method of claim 3 wherein the displayed delays comprise delays for the same circuit implemented in FPGAs with different speed grades.

5. A method for displaying a macro symbol representing an FPGA circuit comprising blocks and nets, the method comprising the steps of:

a) receiving a command to display the macro symbol; and b) displaying the macro symbol along with a multiplicity of delays, wherein the displayed delays comprise separately displayed block delays and net delays.

6. A method for annotating timing information onto a schematic, the method comprising the steps of:

a) receiving a command to display a macro symbol;

b) reading a timing formula corresponding to the macro symbol, the timing formula representing a macro delay in terms of delays included in a device speeds file;

c) retrieving relevant device delays for a plurality of target FPGAs from the device speeds file;

d) calculating a plurality of macro delays for the plurality of target FPGAs based on the timing formula and the delays retrieved from the device speeds file; and e) displaying the plurality of macro delays along with the macro symbol.

7. The method of claim 6, wherein the timing formula is read from the file storing the display information for the symbol.

8. A method for displaying a macro symbol, the method comprising the steps of:

a) designating one of a group of available macro delays to be displayed;

b) receiving a command to display the macro symbol; and c) displaying the macro symbol alone with the designated delay, wherein the group of available macro delays comprises delays for the same circuit implemented in different FPGAs.

9. The method of claim 8 wherein the group of available macro delays comprises delays for the same circuit implemented in FPGAs with different speed grades.

* * * * *